United States Patent
Yeh et al.

[11] Patent Number: 6,087,276
[45] Date of Patent: Jul. 11, 2000

[54] METHOD OF MAKING A TFT HAVING AN ION PLATED SILICON DIOXIDE CAPPING LAYER

[75] Inventors: Ching-Fa Yeh; Tai-Ju Chen; Jiann-Shiun Kao, all of Hsinchu, Taiwan

[73] Assignee: National Science Council, Taiwan

[21] Appl. No.: 08/741,144

[22] Filed: Oct. 29, 1996

[51] Int. Cl.[7] .............................. H01L 21/84; H01L 21/56
[52] U.S. Cl. ...................... 438/788; 438/149; 438/787; 438/DIG. 902
[58] Field of Search .................... 437/21, 40 TFT, 437/41 TFT, 238; 148/DIG. 118; 204/192.23; 438/142, 149, 151, 778, 787, 788, DIG. 902

[56] References Cited

U.S. PATENT DOCUMENTS

| | | | |
|---|---|---|---|
| 4,619,748 | 10/1986 | Moll et al. | 204/192.31 |
| 4,624,859 | 11/1986 | Akira et al. | 437/238 |
| 4,683,838 | 8/1987 | Kimura et al. | 118/715 |
| 4,915,772 | 4/1990 | Fehlner et al. | 117/43 |
| 5,313,075 | 5/1994 | Zhang et al. | 257/57 |

FOREIGN PATENT DOCUMENTS

| | | |
|---|---|---|
| 59-44831 | 3/1984 | Japan . |
| 59-217332 | 12/1984 | Japan . |
| 63-62238 | 3/1988 | Japan . |
| 1-123061 | 5/1989 | Japan . |
| 3-73556 | 3/1991 | Japan . |
| 4-186634 | 7/1992 | Japan . |
| 6-13370 | 1/1994 | Japan . |
| 6-73536 | 3/1994 | Japan . |
| 6-128731 | 5/1994 | Japan . |
| 6-232117 | 8/1994 | Japan . |
| 7-335880 | 12/1995 | Japan . |

OTHER PUBLICATIONS

K. H. Guenther, et al., J.Vac. Sci. techno. A7(3)(1989) 1436 "Microstructure . . . by reactive ion plating", May 1989.

H. K. Pulker, J.Vac. Sci. Technol. A10(4)(1992)1669 "Ion plating as an industrial manufacturing method", Jul. 1992.

I–Wei Wu, et al., entitled "Passivation Kinetics of Two Types of Defects in Polysilicon TFT by Plasma Hydrogenation," IEEE Electron Device Lett., vol. 12, No. 4, pp. 181–183, 1991.

Ching–Fa Yeh, Shyue–Shyh Lin, Chun–Lin Chen, and Yu–Chi Yang, entitled "Novel Technique for $SiO_2$ Formed by Liquid–Phase Deposition for Low–Temperature Processed Polysilicon TFT," IEEE Electron Device Letters, vol. 14, No. 8, pp. 403–405, 1993.

Ching–Fa Yeh, Tai–Ju Chen, Ching–Lin Fan and JiannShiun Kao, entitled "Novel Gate Dielectric Films Formed by Ion Plating for Low–Temperature–Processed Polysilicon TFT's," IEEE Electron Device Letters, vol. 17, No. 9, pp. 421–424, Sep. 1996.

*Primary Examiner*—Charles Bowers
*Assistant Examiner*—Evan Pert
*Attorney, Agent, or Firm*—Hitt Chwang & Gaines, P.C.

[57] ABSTRACT

A method of making a polysilicon thin-film transistor is presented. Device characteristics are improved when a silicon dioxide capping layer is formed by an ion plating method.

4 Claims, 5 Drawing Sheets

METHOD OF MAKING A TFT HAVING AN ION PLATED SILICON DIOXIDE CAPPING LAYER

FIELD OF THE INVENTION

The present invention relates generally to room-temperature processed polysilicon thin-film transistors, and more particularly to polysilicon thin-film transistors having a $SiO_2$ capping layer grown by a room-temperature ion plating technique.

BACKGROUND OF THE INVENTION

Thin-film transistors (TFT's) on a transparent substrate are important for making an active-matrix liquid-crystal display (AMLCD). Because polysilicon thin-film transistors (poly-Si TFT's) have a high field-effect mobility, the potential to realize very large area LCD's, and a capability for peripheral driver circuit integration, much effort has been devoted to developing high-performance poly-Si TFT's.

Using a conventional glass substrate is advantageous for reducing the cost of fabricating TFT's. To realize glass substrate TFT's, the maximum process temperature must be below 600° C. In poly-Si TFT's manufactured under this low temperature limitation, grain boundaries and intragranular defects exert a profound influence on device characteristics and degrade carrier transport. Passivation by hydrogen plasma has been shown to reduce the trap-state density and improve device characteristics. However, the passivation by hydrogen plasma has to be carried out for a period of time long enough for hydrogen to diffuse to grain boundaries and intragranular defects (I-Wei Wu, et al., entitled "Passivation Kinetics of Two Types of Defects in Polysilicon TFT by Plasma Hydrogenation," IEEE Electron Device Lett., Vol. 12, No. 4, pp. 181–183, 1991). In addition to this long hydrogenation time disadvantage, the hydrogen-silicon bonds resulting from the hydrogenation are weak and thus are vulnerable after the device works for a long period of time. The device characteristics deteriorate, so that creates a reliability problem. Various chemical vapor deposition (CVD) methods have been used to fabricate a $SiO_2$ film as the capping layer of poly-Si TFT's, such as atmospheric pressure CVD (APCVD), low pressure CVD (LPCVD), and plasma enhanced CVD (PECVD), etc. However, the $SiO_2$ films grown by these methods often have defects like containing moisture or hydrogen bonds therein, a non-smooth surface or a porous microstructure. Moreover, the temperatures of these CVD methods are still too high as compared to the requirements of a low-temperature processed poly-Si TFT.

The present inventors in their pending U.S. patent application (Ser. No. 08/699,234; filing date: Aug. 19, 1996) disclose a poly-Si TFT having a $SiO_2$ gate insulator grown by ion plating and a method for fabricating the same. The $SiO_2$ film grown by ion plating has smooth surfaces with dense microstructure and is substantially free of impurities, which shows superior electrical characteristics such as a low leakage current density and a low interface-trap density. Therefore, the poly-Si TFT so-obtained demonstrates superior device characteristics.

SUMMARY OF THE INVENTION

The present invention discloses a polysilicon thin-film transistor (poly-Si TFT) having a $SiO_2$ capping layer grown by ion plating.

A suitable method for fabricating the present poly-Si TFT comprises the following steps:

(a) forming a $SiO_2$ bottom layer on a substrate;
(b) forming and patterning a polysilicon layer on said $SiO_2$ bottom layer so that an active region of said polysilicon layer is defined on a top surface of said $SiO_2$ bottom layer with parts of the top surface being exposed;
(c) forming a $SiO_2$ dielectric layer as a gate insulator on the entire surfaces of said active region of said polysilicon layer and the exposed top surface of said $SiO_2$ bottom layer;
(d) forming a gate polysilicon on a top surface of said gate insulator with parts of the top surface being exposed, said gate polysilicon separating said active region of said polysilicon layer into a drain region, a channel region and a source region, and doping said gate polysilicon, said drain and source regions through said gate insulator;
(e) forming a capping layer over the entire surfaces of said gate polysilicon and the exposed top surface of said gate insulator by ion plating; and
(f) forming a gate electrode in a contact hole formed in said capping layer, a drain electrode and a source electrode in two contact holes formed through said capping layer and said gate insulator so that said doped gate polysilicon, drain and source regions are electrically connected to said gate, drain and source electrodes respectively.

Said ion plating in step (e) is preferably carried out in an ion plating chamber in accordance with the following conditions:

Pressure of oxygen in said chamber: $1.5 \times 10^{-4}$ to $3 \times 10^{-3}$ mbar Pressure of working gas at an inlet of said chamber: 2–5 mbar Power of electron-beam: 3–8 KW Deposition temperature: 20–400° C.

Arc voltage: 40–80 V

Arc current: 40–80 A

Deposition rate: <5 Å/sec.

A suitable gas for use as the working gas in said ion plating is argon.

DETAILED DESCRIPTION OF THE PREFERRED EMBODIMENTS

An a $SiO_2$ film is grown by ion plating at room temperatures as a capping layer of a polysilicon thin-film transistor (poly-Si TFT). The present inventors have found that the trap-state density of the polysilicon channel is reduced by the ion plating carried out in an oxygen plasma atmosphere and the device characteristics are improved without the conventional passivation treatment. As a result, the fabrication efficiency and quality of the poly-Si TFT's are both enhanced. The poly-Si TFT containing an ion plated $SiO_2$ film as the capping layer in accordance with the present invention has a superior field-effect mobility, on/off current ratio, threshold voltage and subthreshold swing, and thus is very suitable for use in fabricating a LCD device.

A method for fabricating a poly-Si TFT in accordance with one of the preferred embodiments of the present invention is similar to that of a conventional method for fabricating a poly-Si TFT except that the former uses an ion plating method to form the $SiO_2$ capping layer and the latter utilizes a conventional semiconductor fabrication technique such as various chemical vapor deposition methods to form the $SiO_2$ capping layer.

The features, functions and advantages of the present invention will be more readily understood upon a thoughtful deliberation of the following detailed description of one of the preferred embodiments of the present invention in conjunction with the accompanying drawings, wherein like numerals represent like elements.

Figure 1A:
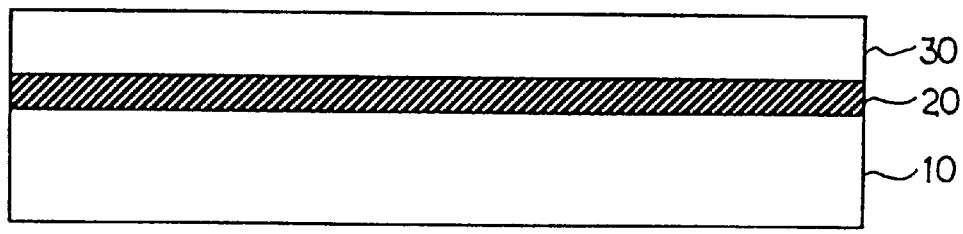
FIGS. 1(a) to 1(e) are schematic sectional views which illustrate a procedure for fabricating a polysilicon thin-film transistor having an ion plated $SiO_2$ capping layer in accordance with the present invention.

As shown in FIG. 1(a), a $SiO_2$ bottom layer 20 having a thickness of about 5000 Å was formed on a glass substrate 10 by a low-temperature chemical vapor deposition. An amorphous silicon layer 30 having a thickness of about 1000 Å was then formed on said $SiO_2$ bottom layer 20 by low pressure chemical vapor deposition (LPCVD) followed by annealing at 600° C. for 24 hours so that said amorphous silicon layer 30 was transformed into a polysilicon layer 30.

Figure 1B:
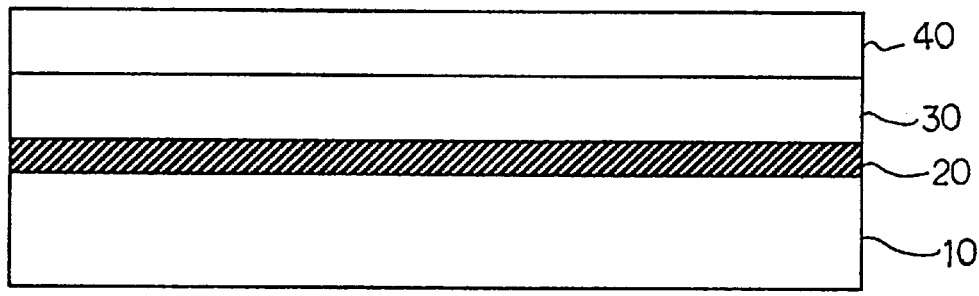

Referring to FIG. 1(b), said polysilicon layer 30 was patterned to define an active region prior to forming a $SiO_2$ dielectric layer as a gate insulator 40 on the entire surfaces of said active region of said polysilicon layer 30 and the exposed top surface of said $SiO_2$ bottom layer 20. Said $SiO_2$ dielectric layer has a thickness of about 400 Å and was formed by liquid phase deposition, or "LPD" (Ching-Fa Yeh, Shyue-Shyh Lin, Chun-Lin Chen, and Yu-Chi Yang, "Novel Technique for $SiO_2$ Formed by Liquid-Phase Deposition for Low-Temperature Processed Polysilicon TFT" IEEE ELECTRON DEVICE LETTERS, Vol. 14, No. 8, pp. 403–405, 1993).

Figure 1C:
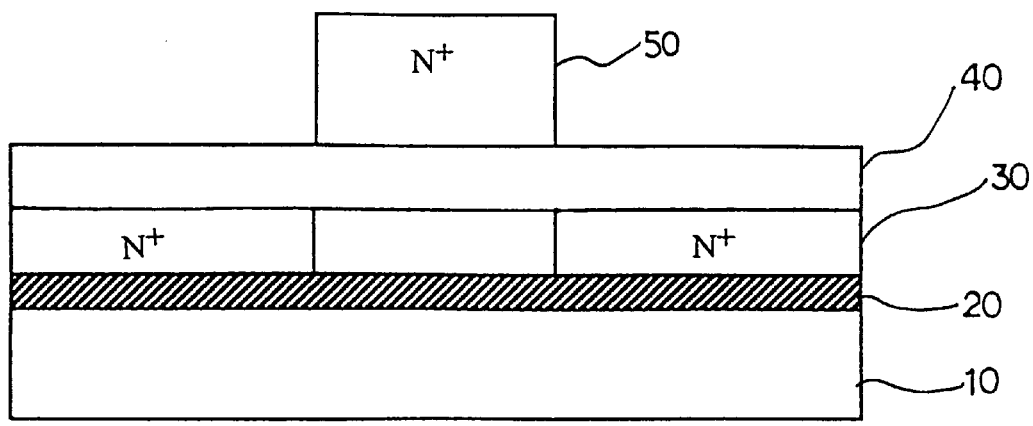

A gate polysilicon layer was formed on said gate insulator 40 by LPCVD, and then patterned to define a gate polysilicon 50 which separates said active region of said polysilicon layer 30 into a drain region, a channel region and a source region. Said gate polysilicon 50, said drain and source regions were then doped with $N^+$-type impurities by ion implantation, as shown in FIG. 1(c).

Figure 1D:
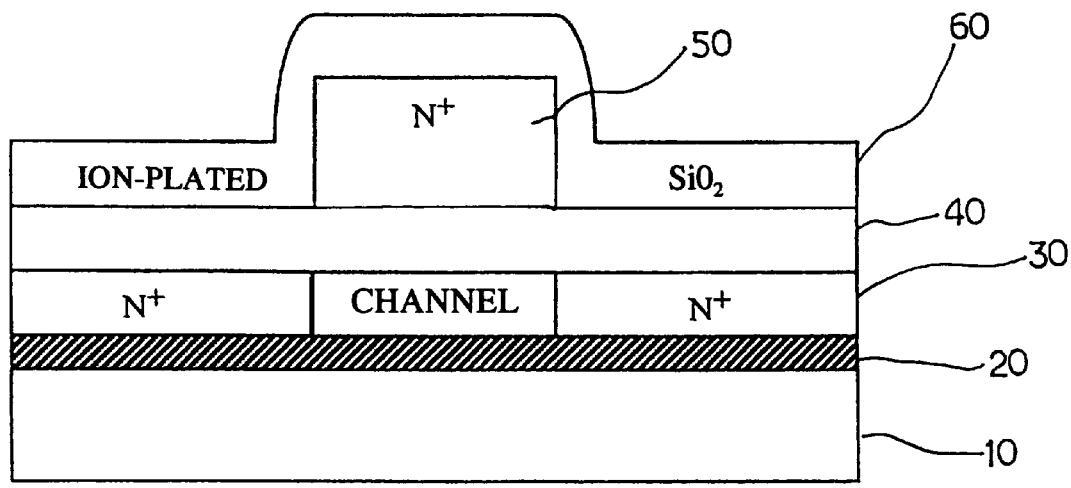

A capping layer 60 over the entire surfaces of said gate polysilicon 50 and the exposed top surface of said gate insulator 40 was formed by ion plating (IP), as shown in FIG. 1(d). The low-voltage reactive IP $SiO_2$ film was prepared as the capping layer 60 in Balzers BAP 800 system (K. H. Guenther, B. Loo, D. Burns, J. Edgell, D. Windham, and K. K. Muller, "Microstructure Analysis of Thin Films Deposited by Reactive Evaporation and by Reactive Ion Plating," J. Vac. Sci. Technol. A, Vol. 7, No. 3, P. 1436, 1989). The starting material, silicon was evaporated by an electron beam evaporator. The 3.9 mbar argon in the plasma source cavity was ionized by the heated filament. The oxygen gas was let directly into the deposition chamber. The partial Ar pressure in the deposition chamber is $3 \times 10^{-4}$ mbar during deposition. The total pressure was fixed at $1.1 \times 10^{-3}$ mbar, while the base pressure was $4 \times 10^{-5}$ mbar. The substrate obtained a negative self-bias of −10 to −20 V from the plasma sheath. The electron beam power was 4.6 KW. The temperature of the substrate was 23° C. at the beginning of IP-oxide deposition process, and increased to 110° C. at the end of deposition. The arc voltage was 66 V, and the arc current was 56 A. The ion plating was carried out for a period of 40 minutes to form a $SiO_2$ layer having a thickness of about 500 nm.

Figure 1E:
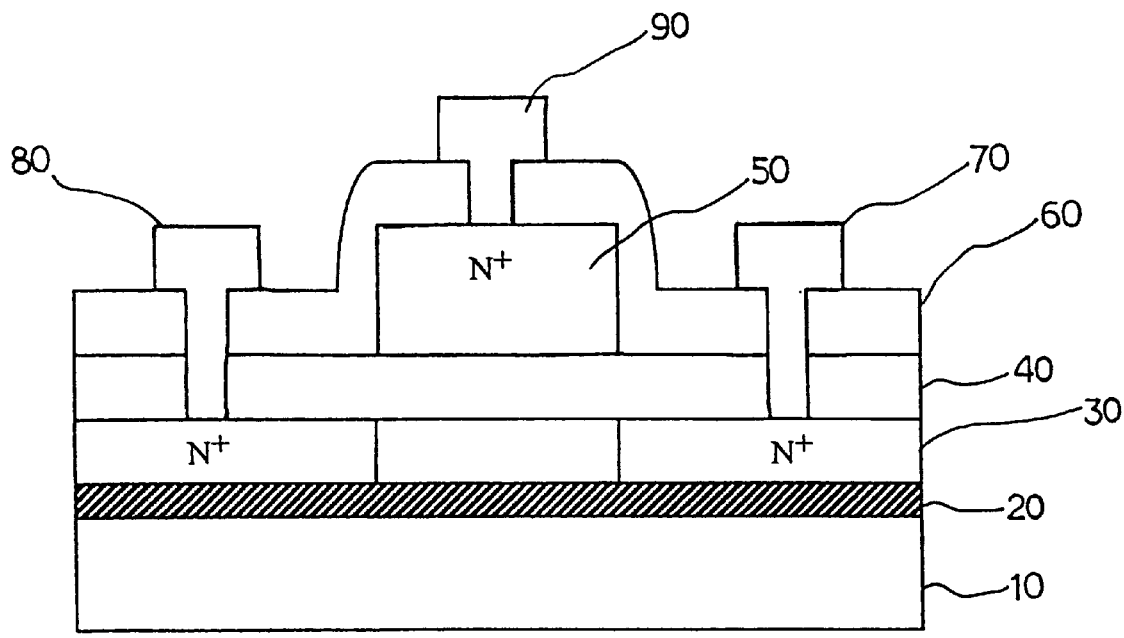

Prior to depositing an Al film on said capping layer 60 contact holes were formed in said capping layer 60, and said Al film was then patterned to define a gate electrode 90, a drain electrode 70 and a source electrode 80, as shown in FIG. 1(e).

The poly-Si TFT's as-fabricated were annealed at 400° C. for a period of 30 minutes and further subjected to a hydrogenation treatment at 300 ° C. for various periods of time.

For comparative purposes, control poly-Si TFT's were also prepared in accordance with the procedures described above except that the $SiO_2$ capping layer 60 grown by ion plating was replaced by a TEOS $SiO_2$ layer grown by plasma enhanced CVD.

Figure 2:
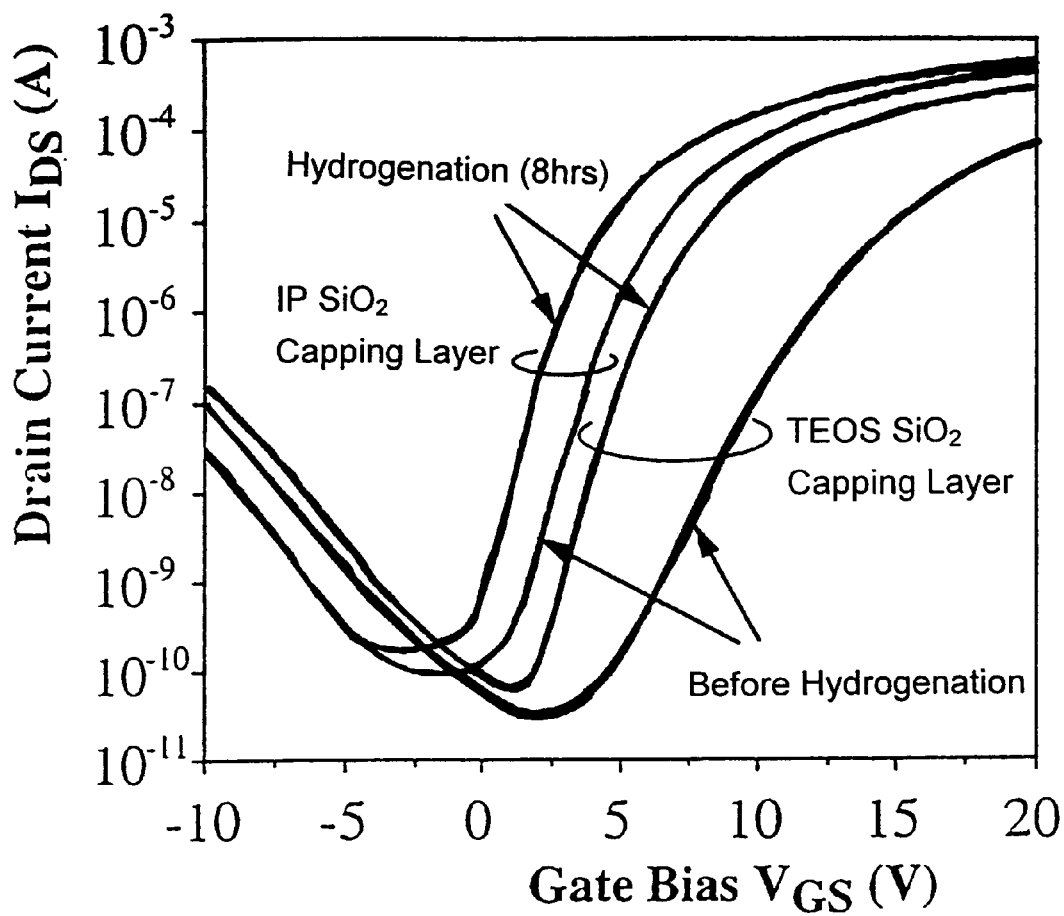
FIG. 2 is a gate voltage ($V_{GS}$) vs. drain current ($I_{DS}$) plot which shows the $I_{DS}$-$V_{GS}$ transfer characteristics of as-fabricated and hydrogenated poly-Si TFT's of the present invention at drain voltage of 5 V and a ratio of channel width to channel length equal to 20 μm to 5 μm, as well as the $I_{DS}$-$V_{GS}$ transfer characteristics of as-fabricated and hydrogenated poly-Si TFT's having a TEOS $SiO_2$ capping layer grown by plasma enhanced CVD.

FIG. 2 shows the $I_{DS}$–$V_{GS}$ transfer characteristics of as-fabricated and hydrogenated poly-Si TFT's of the present invention and of the control examples at drain voltage of 5 V and a ratio of channel width to channel length equal to 20 μm to 5 μm, wherein $I_{DS}$ is drain current and $V_{GS}$ is gate voltage. The device characteristics are listed in Table 1. It can be seen from FIG. 2 and Table 1 that the poly-Si TFT's having an ion plated capping layer already has superior threshold voltage, subthreshold swing, and ON/OFF current ratio prior to hydrogenation, as well as a mobility about 2.5 times of that of the control poly-Si TFT's having a TEOS $SiO_2$ capping layer. It is believed that the traps in the poly-Si channel of the present poly-Si TFT are filled by oxygen plasma ions during the deposition of the $SiO_2$ capping layer by ion plating. Therefore, the trap-state density of the present poly-Si TFT is about one quarter of that of the control poly-Si TFT having a TEOS $SiO_2$ capping layer. After hydrogenation, the characteristics of the present poly-Si TFT and of the control poly-Si TFT are both improved. However, the characteristics of the hydrogenated poly-Si TFT of the control example are still worse than those of the as-fabricated poly-Si TFT of the present invention.

TABLE 1

| Capping layer | Hydrogenation time | Threshold voltage (V) | Subthreshold swing (V/dec) | ON/OFF current ratio | Mobility (cm²/V•s) | Trap-state density (cm⁻²) |
|---|---|---|---|---|---|---|
| ion plating | — | 4.23 | 0.94 | $4.10 \times 10^6$ | 24.3 | $1.05 \times 10^{13}$ |
|  | 8 hours | 2.33 | 0.77 | $3.18 \times 10^6$ | 25.6 | $8.37 \times 10^{12}$ |
| TEOS | — | 11.0 | 1.61 | $2.09 \times 10^6$ | 9.71 | $2.70 \times 10^{13}$ |
|  | 8 hours | 5.49 | 0.84 | $4.75 \times 10^6$ | 14.4 | $1.05 \times 10^{13}$ |

—: no hydrogenation

Figure 3:
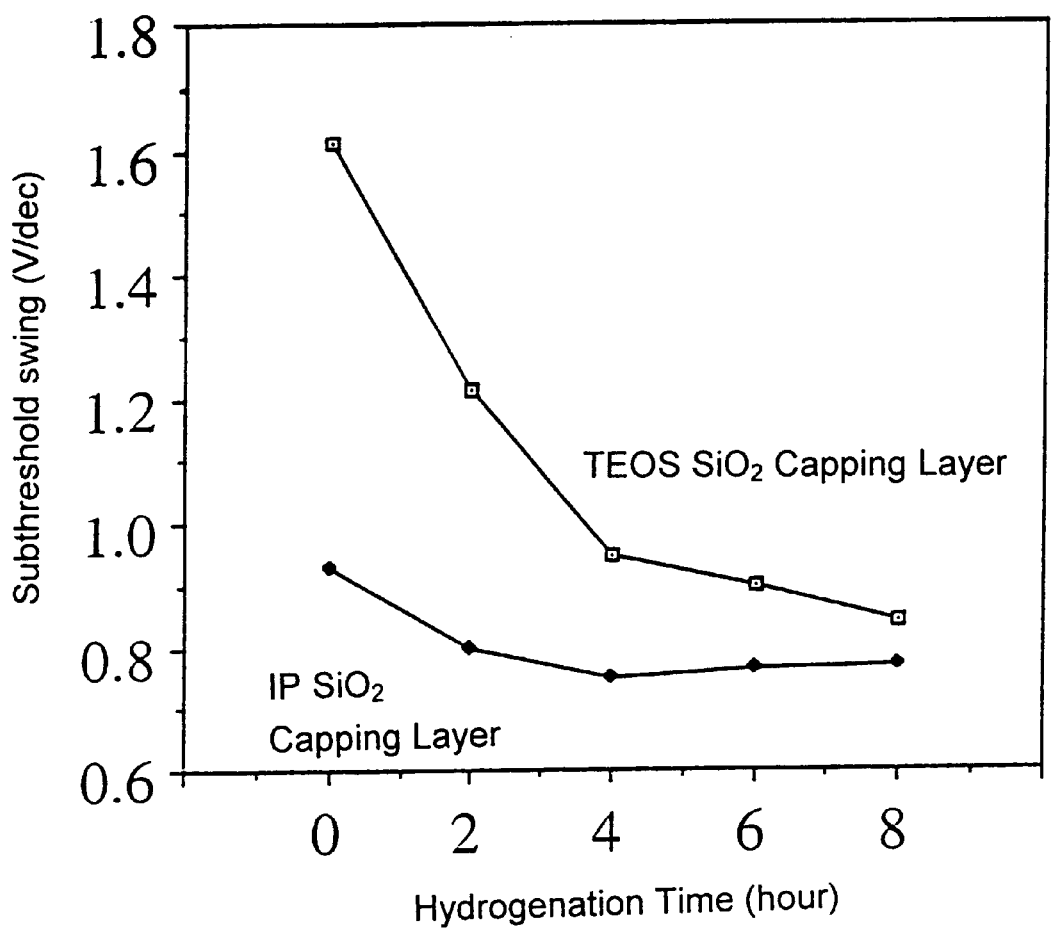
FIG. 3 is a hydrogenation time (hour) vs. subthreshold swing (V/dec) plot which shows the effect of hydrogenation time on the subthreshold swing of the poly-Si TFT's at drain voltage of 5 V and a ratio of channel width to channel length equal to 20 μm to 5 μm, wherein curve "—□—" represents the poly-Si TFT having a TEOS $SiO_2$ capping layer and curve "—◆—" represents the poly-Si TFT having an ion plated $SiO_2$ capping layer.

FIG. 3 shows the effect of hydrogenation time on the subthreshold swing of the poly-Si TFT's at drain voltage of 5 V and a ratio of channel width to channel length equal to 20 μm to 5 μm, wherein curve "—□—" represents the poly-Si TFT's having a TEOS SiO₂ capping layer and curve "—♦—" represents the poly-Si TFT's having an ion plated SiO₂ capping layer. It can be seen from FIG. 3 that the effect of hydrogenation time on the subthreshold swing of the present poly-Si TFT's having an ion plated SiO₂ capping layer is not so significant as compared to the poly-Si TFT's having a TEOS SiO₂ capping layer, and this is because that most of the traps in the poly-Si channel of the present poly-Si TFT's are filled by oxygen plasma ions during the deposition of the SiO₂ capping layer by ion plating prior to the hydrogenation.

Figure 4:
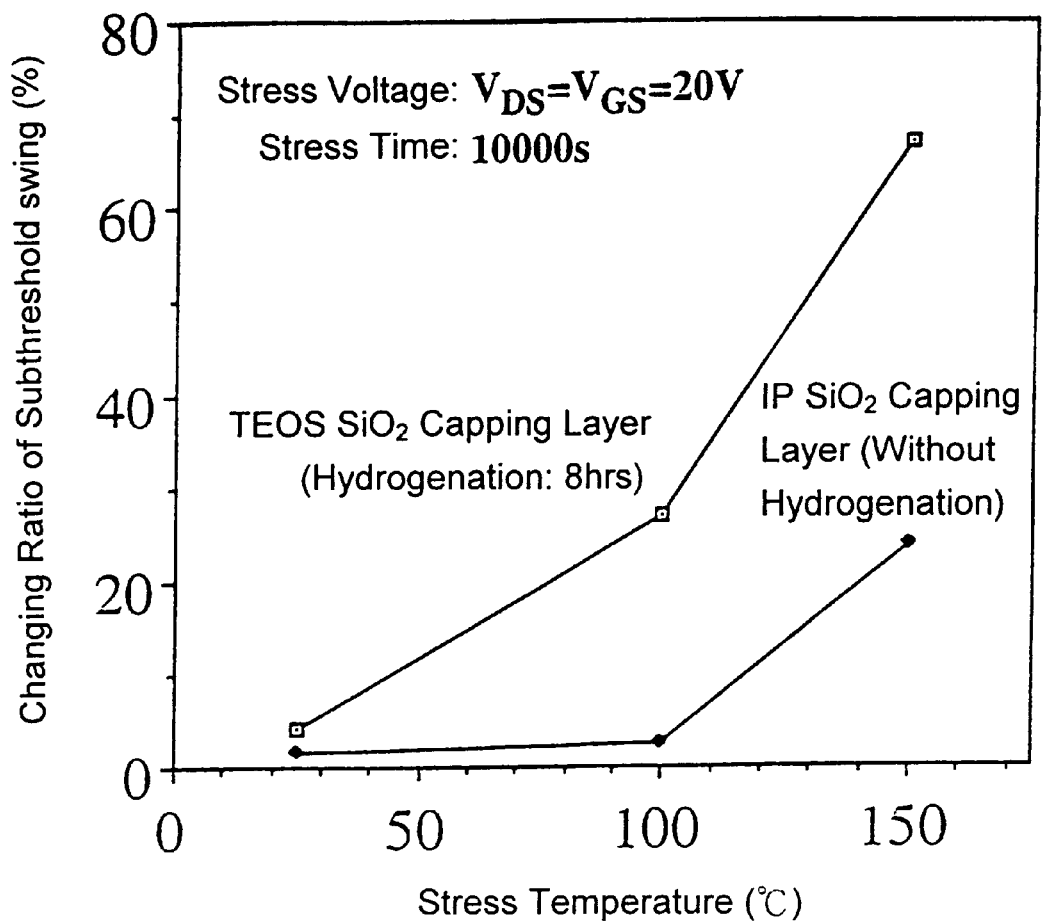
FIG. 4 is a stress temperature (° C.) vs. changing ratio of subthreshold swing (%) plot which shows the long-term stability of the poly-Si TFT's at a ratio of channel width to channel length equal to 20 μm to 5 μm, wherein the stress voltage at drain voltage and at gate voltage are both set at 20 V, and the stress time is 10,000 seconds, wherein curve "—□—" represents the poly-Si TFT having a TEOS $SiO_2$ capping layer hydrogenated eight hours and curve "—♦—" represents the poly-Si TFT having an ion plated $SiO_2$ capping layer without hydrogenation.

For long-term operation, device reliability is of significant importance. FIG. 4 is a stress temperature (° C.) vs. changing ratio of subthreshold swing (%) plot which shows the long-term stability of the poly-Si TFT's at a ratio of channel width to channel length equal to 20 μm to 5 μm, wherein the stress voltage at drain voltage and at gate voltage are both set at 20 V, and the stress time is 10,000 seconds. As it is shown in FIG. 4, the poly-Si TFT's having an ion plated SiO₂ capping layer without hydrogenation does not substantially deteriorate in terms of the changing ratio of subthreshold swing at a stress temperature of 100° C. and a stress time of 10,000 seconds. On the contrary, the poly-Si TFT's having a TEOS SiO₂ capping layer, which was hydrogenated for eight hours, has a changing ratio of subthreshold swing of about 28% at a stress temperature of 100° C. and a stress time of 10,000 seconds, which increases to about 67% at a stress temperature of 150° C. It can be concluded from the data shown in FIG. 4 that the oxygen-silicon bonds formed during the ion plating are more reliable than the hydrogen-silicon bonds formed during the hydrogenation.

Having thus described the present invention, which is now deemed appropriate for Letters Patent is set out in the following appended claims.

What is claimed is:

1. A method for fabricating a polysilicon thin-film transistor comprising the following steps:

(a) forming a SiO₂ bottom layer on a substrate;

(b) forming and patterning a polysilicon layer on said SiO₂ bottom layer so that an active region of said polysilicon layer is defined on a top surface of said SiO₂ bottom layer with parts of the top surface being exposed;

(c) forming a SiO₂ dielectric layer as a gate insulator on the entire surface of said active region of said polysilicon layer and on the exposed top surface of said SiO₂ bottom layer;

(d) forming a gate polysilicon on a top surface of said gate insulator with parts of the top surface being exposed, said gate polysilicon separating said active region of said polysilicon layer into a drain region, a channel region and a source region, and doping said gate polysilicon, said drain and source regions through said gate insulator;

(e) forming a capping layer over the entire surfaces of said gate polysilicon and the exposed top surface of said gate insulator by ion plating; and (f) forming a gate electrode in a contact hole formed in said capping layer, a drain electrode and a source electrode in two contact holes formed through said capping layer and said gate insulator so that said doped gate polysilicon, drain and source regions are electrically connected to said gate, drain and source electrodes respectively.

2. The method according to claim 1, wherein said ion plating in step (e) is carried out in an ion plating chamber in accordance with the following conditions:

Pressure of oxygen in said chamber: $1.5 \times 10^{-4}$ to $3 \times 10^{-3}$ mbar;

Pressure of working gas at an inlet of said chamber: 2–5 mbar;

Power of electron-beam: 3–8 KW;

Deposition temperature: 20–400° C.;

Arc voltage: 40–80 V; and

Arc current: 40–80 A.

3. The method of making a polysilicon thin-film transistor according to claim 2, wherein said ion plating in step (e) is carried out at a deposition rate <5 Å/sec.

4. The method according to claim 2, wherein said working gas is argon.

* * * * *